United States Patent [19]

Steigerwald et al.

[11] 4,391,742

[45] * Jul. 5, 1983

[54] PASTE COMPOSITION FOR THE PRODUCTION OF ELECTRICALLY CONDUCTIVE AND SOLDERABLE STRUCTURES

[76] Inventors: Wolf-Erhard Steigerwald, Rua de Fez, 731, 4.000 Porto, Portugal; Peter Ambros, Am Wacholderrain 12, 8741 Hohenroth Ortsteil Leutershausen; Erich Gatzke, Wilhelm-Busch-Str. 56, 3260 Rinteln, both of Fed. Rep. of Germany

[*] Notice: The portion of the term of this patent subsequent to Feb. 3, 1998, has been disclaimed.

[21] Appl. No.: 189,365

[22] Filed: Sep. 22, 1980

Related U.S. Application Data

[63] Continuation-in-part of Ser. No. 918,378, Jun. 23, 1978, Pat. No. 4,248,921.

[30] Foreign Application Priority Data

Jun. 24, 1977 [DE] Fed. Rep. of Germany ....... 2728465

[51] Int. Cl.³ ............................ H01B 1/06; H01B 1/02
[52] U.S. Cl. ................................. 252/512; 252/513; 252/514; 252/518; 106/1.13; 106/1.14; 106/1.15; 106/1.18; 106/1.19; 106/1.21; 524/401; 524/420; 524/423; 524/435; 524/439; 524/440
[58] Field of Search ............... 252/511, 512, 518, 513, 252/514; 260/37 R, 37 M; 106/1.05, 1.13, 1.19, 1.14, 1.21, 1.15, 1.18; 428/901; 156/1, 901; 524/401, 403, 420, 423, 435, 439, 440

[56] References Cited

U.S. PATENT DOCUMENTS

| | | | |
|---|---|---|---|
| 4,009,093 | 2/1977 | Luch | 252/511 |
| 4,051,454 | 9/1977 | Leiser et al. | 252/511 |
| 4,127,699 | 11/1978 | Aumiller et al. | 252/511 |
| 4,170,677 | 10/1979 | Hutcheson | 252/511 |

Primary Examiner—Josephine Barr
Attorney, Agent, or Firm—Wigman & Cohen

[57] ABSTRACT

Paste composition for producing an electrically conductive and solderable structure along with the resulting article are disclosed. Metal particles, metal salts and an organic polymer binder are formed into a paste which is applied to a non-conductive substrate by printing or the like. The paste is heated to permit metal salts to migrate to the surface of the binder where they become concentrated. During metallizing the salts are removed by the bath and metal is deposited in pores formed in the binder by the dissolved salts. The metal layer is adherent to the binder and provides good solderable points.

7 Claims, No Drawings

PASTE COMPOSITION FOR THE PRODUCTION OF ELECTRICALLY CONDUCTIVE AND SOLDERABLE STRUCTURES

CROSS-REFERENCE TO RELATED APPLICATION

This is a continuation-in-part application of application Ser. No. 918,378, filed June 23, 1978, now U.S. Pat. No. 4,248,921 filed under the provisions of 35 U.S.C. 119.

BACKGROUND OF THE INVENTION

The invention relates to a paste composition useful for the production of electrically conductive and solderable structures generally secured to a non-conductive substrate.

A number of methods for the production of printed circuit boards are already known in which dispersions of organic polymers having a metal particle component, preferably silver particles, are deposited onto a non-conductive substrate, such as, hard paper or aluminum oxide, by spraying, drawing or screen printing processes. The coated substrate is cured by a subsequent thermal treatment. Electrical structures of this nature, which contain highly cross-linked and therefore thermosetting polymers, such as, epoxides or polyphenols as binding agents, are also distinguished by a good adhesiveness with regard to the metal particles dispersed therein. The problem with electrical structures of this type, however, resides with the electrical contacts which are not solderable.

One known method for the production of printed circuits utilizes a heat hardenable or heat-deformable plastic as the substrate material for the conductive component. This substrate is a mixture of insulating material and minute copper oxide particles on its outer surface, i.e., on the portions of the outer surface which are to be provided with conductive paths. The particles become rigidly connected with the insulating material during curing. The copper oxide particles on the surface are hereafter reduced to copper by sulphuric acid, phosphoric acid, etc. The surface is then rinsed and placed in an electroless bath in which copper or another suitable metal is built-up. The weight ratio of the copper oxide particles fluctuates between 0.25 and 80%. If the copper oxide content is near the lower value, it may be necessary to mechanically brush or scrape the surface in order to expose the particles near the surface to acid treatment. Without this additional preliminary handling the separation would require several hours. The acid treated substrate must immediately be additionally processed to avoid oxidation of the metallic copper which is exposed to the atmosphere. In electrical structures of this type the electrical capacity is determined exclusively by the thickness of the copper layer. To maintain good conductivity, the copper layer thickness must be relatively large. Building a relatively large copper layer from an electroless or currentless coppering bath, however, is a time consuming process even without the aforementioned additional preliminary handling. Another disadvantage of the known process resides in the fact that the adhesiveness of an electroless deposited copper layer generally decreases with increasing layer thickness, resulting in decreased reliability at a soldering point.

OBJECTS AND SUMMARY OF THE INVENTION

It is therefore an object of the present invention to avoid the disadvantage of the known techniques and to provide a paste composition especially useful in the production of improved electrically conductive and simultaneously solderable structures. Another object of the present invention is to provide a paste composition resulting in an electrically conductive structure, as aforementioned, wherein the conductivity is not exclusively determined by the metal layer deposited from an electroless metalization bath, but in which a suitable adherent metal layer is provided to achieve highly reliable individual soldering locations.

These and other objects are achieved according to the present invention by providing an improved paste composition and applying curable paste in desired patterns onto a non-conductive substrate and thereafter curing the paste to form an electrically conductive structure. The paste composition comprises minute particles which effect the electrical conductivity of the structure, metal salts and/or substances which form metal salts in dilute acids (hereinafter "metal salts") and a polymerizable binder. The metal salts are enriched on the outer surface of the structure by wetting or flotation agents for reasons noted hereinafter and are soluble in galvanic or autocatalytically operating metallization baths.

The polymerizable binder is also provided with a metallic layer formed by galvanic or autocatalytic deposition at the locations provided for solder connections. The metallic layer is firmly connected with the underlying conductive structure due to the provision of cavern-like pores formed in the surface of the conductive structure by dissolving the metal salts located in the surface of the conductive structure.

The electrically conductive structures are secured to the substrate by means of crevices or openings arranged in the substrate for receiving the penetrating material therein. The conductive structure can be directed into the substrate openings by sucking the paste therethrough using negative pressure.

Where all or portions of the conductive structures are not provided with the metal layer, such portions can be covered with a solder sealing lacquer.

The electrically conductive structures can also be located on both sides of a non-conductive substrate and are electrically connected with each other by means of crevices or openings arranged in the substrate. These openings are completely or partially filled with the electrically conductive structure material. Again, as before, all or portions of the conductive structure surface which are not to be covered with a metal layer, can be covered with a solder sealing lacquer.

The electrically conductive structures formed using the paste composition of the present invention may also be arranged in sandwich-like fashion in several planes separated by insulating layers, and electrically connected with each other through openings in the insulating layer. The uppermost layer of the electrically conductive structure may be provided with a metal layer or with a solder sealing lacquer, as aforementioned.

According to the present invention, the organic polymer binder employed is advantageously a caprolactam-blocked adduct of the isophorondiisocyanate and an oxyester of the hydroxyl group. The organic polymer can also be a mixture of caprolactam-blocked polyurethane with silicone resins and/or acetal resins and/or vinyl chloride-vinylacetatecopolymers. Examples of such polymers are those sold by Bayer under the trademark Baysilon-Harz P 150 K and products sold by Wacker under the tradename Siliconharzlösung RE and Vinnol E 15/45 M.

The minute particles employed which effect the electrical conductivity of the structure are advantageously metal particles, such as, silver, gold, nickel, metals of the platinum group, silver or gold coated copper or mixtures thereof. The metal particles can be of plateletlike or microcrystalline form or a mixture thereof.

To alter the specific conductivity of the electrically conductive structure, the weight ratio of the metal particles can be suitably varied with respect to the organic polymer. A preferred weight ratio of about 1:1 to 6:1, or more, may be used.

The metal salts incorporated in the organic polymer, in addition to the metal particles, are desirably copper (II) sulfate, copper (I) chloride, copper (II) formiate, copper (II) acetate, sodium chloride, sodium sulfite, lithium chloride, sodium carbonate, silver chloride, silver sulfate, silver nitrate and/or mixtures thereof. The concentration of metal salts present in the organic polymer paste is generally up to about 30% by weight of the metal particles. A preferred concentration ranges from about 10% to about 20%.

A non-ionic or anionic active wetting agent in amounts up to about 3% can be utilized to effect concentration of the metal salts at or near the surface of the cured organic polymer. The flotation agent employed can be Byk O, a tradmarked product of Byk-Mallinckrodt.

The past produced according to the process can be spread on the non-conductive substrate by conventional techniques, e.g., spraying, troweling, printing. Screen printing is preferred.

The galvanic or autocatalytic deposited metal layer can be silver, copper or tin. If the metal layer is copper, it can be additionally covered with a second relatively thin metal layer made of a noble metal.

Hard paper, temperature-resistant plastic, ceramic material or metals having a non-conductive surface can be utilized as the non-conductive substrate according to the present invention. The non-conductive substrate can also be flexible.

The electrically conductive and solderable structures according to this invention are made by forming a paste composition comprising a mixture of microcrystalline and platelet-like metal, e.g., silver particles; a water-soluble metal salt, e.g., copper sulfate; a reducing agent, e.g., sulfite compounds; and a non-ionic active wetting agent, dispersed in a polymer binder, e.g., caprolactam-blocked polyurethane with silicone resins and/or acetal resins and/or vinylchloride—vinyl acetate copolymerizates.

The thus-obtained paste is applied to a hard paper substrate by screen printing thereon predetermined conductive paths or surface patterns. The composite is thereafter cured at a temperature of about 175° C.–230° C.

The polymer binding agent is thermoplastic at the curing temperature. In the softened state and before cross-linking is effected metal salt particles are carried to the surface of the polymer and become concentrated. The metal salt particles located at or near the surface of the binding agent are about 5 μm which, when exposed to the subsequent metallizing bath are dissolved therein. In this manner a large number of closely spaced microscopic caverns or pores are provided over the entire surface of the binding agent. The inner surfaces of these caverns are activated for receiving the deposited copper layer or the like and the initiator effect for subsequent metal deposition is attained.

The metal salt component which is dissolved in the metallizing bath has no disruptive effect on the stability of the bath and simplifies the optimal bath control. The cavern-like pores produced yields an optimal anchoring of the metal layer which is deposited in the caverns and additionally covers the conductive paths or surface patterns of the surface of the binding agent.

It has been determined that the presence of a reducing salt, e.g., sodium sulfite, sodium hydrogen sulfite, improves the conductivity of the thus-obtained structure and accelerates the metal, e.g., copper layer deposition from the metallizing bath.

The thus-obtained copper coating does not serve primarily to produce the electrical conductivity of the conductive paths, but rather is primarily used to obtain trouble-free solderability of the electrical structure. It will be appreciated that since the actual electrical conductivity of the conductive paths or surface patterns is determined by the metal particles dispersed in the binding agent, the deposited metal layer can be held relatively thin. Thus, the deposition time for providing a thin copper layer is relatively fast and the resulting layer is sufficient to provide good solderability.

A further advantage resides in the fact that the activation step under acid conditions do not require subsequent neutralization and washing steps.

Because the electrical structure or circuit is itself already electrically conductive, to achieve solderable contact points the electrical circuit can be masked with a known solder sealing lacquer before deposition of the metal layer in a manner such that only the points provided for contacts are metallized and thereby made solderable. In this manner the quantity of metal required is substantially reduced, thereby further simplifying the process, assuring trouble-free bath control, and improving the economy of the process.

Having described the invention in general terms the following examples are provided to more fully illustrate the invention. These examples are not meant to be limiting.

EXAMPLE 1

The paste composition of the present invention can be formulated in the manner shown in Table 1. After the ingredients are mixed by hand or using a mixer, the resulting paste can be applied to a substrate by conventional techniques, e.g., silk screening. The resulting article is cured at temperatures of about 175° C. or higher.

| Paste Ingredients | Broad Range (Wt %) | Preferred Range (Wt %) |
|---|---|---|
| Binder | 12 to 40 | 18 to 25 |
| Metal salts | 5 to 20 | 6 to 12 |
| Metal particles | 40 to 70 | 55 to 65 |
| Reducing agent | 0 to 20 | 6 to 12 |
| Wetting agent | 0 to 3 | 0.5 to 1 |

In the following Examples 2–5 various combinations of paste ingredients are admixed in the manner described in Example 1 to further describe the present invention.

EXAMPLE 2

| Paste Ingredients | Amount (parts by weight) |
|---|---|
| Caprolactam-blocked poly-isocyanate based on isophorondiisocyanate | 13.0 |
| Melamine resin | 7.0 |
| Alkyd resin | 7.0 |
| Micro-crystalline particles of silver (smaller than 5 MK*) | 30.0 |
| Laminar silver particles (smaller than 5 MK) | 39.0 |
| Anti-Terra-U (1) (wetting and dispersing agent) | 0.3 |
| Byketol-O K (2) (leveling agent) | 0.3 |
| Particles of copper sulphate (smaller than 5 MK) | 1.4 |
| Butylcarbitolacetate (3) | 2.0 |

EXAMPLE 3

| Paste Ingredient | Amount (parts by weight) |
|---|---|
| Caprolactam-blocked poly-isocyanate based on isophorondiisocyanate | 11.3 |
| Acetal resin | 6.0 |
| Alkyd resin | 8.0 |
| Anti-Terra-U (wetting and dispersing agent) | 0.5 |
| Byk-VP-360 P (4) | 0.2 |
| Laminar silver particles (smaller than 5 MK) | 60.0 |
| Copper (1) chloride (smaller than 5 MK) | 2.0 |
| Nickel Particles (smaller than 5 MK) | 9.0 |
| Butylcarbitolacetate | 3.0 |

*MK means μm ($10^{-6}$ Meters) $\triangleq 10^4$ Å

EXAMPLE 4

| Paste Ingredient | Amount (parts by weight) |
|---|---|
| Caprolactam-blocked poly-isocyanate based on isophorondiisocyanate | 16.5 |
| Silicone resin | 3.4 |
| Alkyd resin | 10.0 |
| Anti-Terra-U (wetting and dispersing agent) | 0.6 |
| Laminar silver particles (smaller than 5 MK) | 60.0 |
| Sikron 600 EST (5) | 4.0 |
| Silver nitrate | 3.0 |
| Butylcarbitolacetate | 2.5 |

(1) Anti-Terra-U is a trademark product based on a salt of long-chain polyamine amides and a high-molecular, acid ester and is sold by Byk-Mallinckrodt Chemische Produkte GmbH, 734 Walt Whitman Road, Melville, New York 11747. It is protected by West German Patent No. 1,157,327.
(2) Byketol-O K is a trademark product based on a mixture of high-boiling point aromatic compounds, ketones and esters, and is sold by Byk-Mallinckrodt Chemische Produkte GmbH, 734 Walt Whitman Road, Melville, New York 11747.
(3) Butylcarbitolacetate (or diethylene glycol monobutyl ether acetate) is sold by, for example, Fluka Feinchemikalien GmbH, Lilienthalstr, 8, D-7910 Neu-Ulm, among others.
(4) BYK-VP-360 P is a trademark product of a polymer of acrylic acid, ester and silicone dioxide and is sold by Byk-Mallinckrodt Chemische Produkte GmbH, 734 Walt Whitman Road, Melville, New York 11747.
(5) Sikron 600 EST is a trademark product and is a ground quartz powder coated with an epoxy hydrosilicon and is sold by Quarzwerke GmbH, 5020 Frechen 1, W. Germany.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A paste composition for producing electrically conductive and solderable structures comprising:
   about 12 to 40 percent by weight of an organic curable polymer binder, wherein the organic polymer binder is a caprolactam-blocked adduct of isophoronodiisocyanate and an oxyester of the hydroxyl group;
   about 40 to 70 percent by weight of electrically-conducting particles, formed as platelets or microscopic crystals and mixtures thereof, wherein the electrically-conducting particles are metal particles, selected from the group consisting of silver, gold, nickel, particles from the platinum group metals, silver or gold coated copper particles and mixtures thereof, to render said binder electrically conducting;
   about 5 to 20 percent by weight of metal salt particles, the metal particles being capable of being dissolved by external dissolving agents to render the surface of said composition porous, wherein the metal salt particles are selected from the group consisting of copper (II) sulfate, copper (I) chloride, copper (II) formiate, copper (II) acetate, sodium chloride, sodium sulfide, lithium chloride, sodium carbonate, silver chloride, silver sulfate, silver nitrate and mixtures thereof; and
   up to 3 percent by weight of a non-ionic or anionic active wetting agent, which is capable of floating the metal salt particles and concentrating said particles at or near the surface of said paste.

2. The composition according to claim 1, wherein the weight ratio of the metal particles to the organic polymer is at least about 1:1 to 6:1.

3. The composition according to claim 1, wherein the metal salts are present in amounts up to about 30% by weight of the electrically conductive particles.

4. A paste composition for producing electrically conductive and solderable structures comprising:
   about 12 to 40 percent by weight of an organic curable polymer binder, wherein the organic polymer binder is a mixture of caprolactam-blocked polyurethane with silicone resins and/or acetal resins and/or vinyl chloride-vinylacetate-copolymerisates and/or alkyd resins and/or melamin resins in a proportion by weight of polyurethane to the other binders from 10:1 to 0.8:1;
   about 40 to 70 percent by weight of electrically-conducting particles, formed as platelets or microscopic crystals and mixtures thereof, wherein said particles are silver, gold, nickel, particles from the platinum group metals, silver or gold coated copper particles and mixtures thereof, to render said binder electrically conducting;
   about 5 to 20 percent by weight of metal salt particles, said metal salt particles being capable of being dissolved by external dissolving agents to render the surface of said compositions porous, wherein the metal salt particles are selected from the group consisting of copper (II) sulfate, copper (I) chloride, copper (II) formiate, copper (II) acetate, sodium chloride, sodium sulfide, lithium chloride, sodium carbonate, silver chloride, silver sulfate, silver nitrate and mixtures thereof; and
   up to 3 percent by weight of a non-ionic or anionic active wetting agent, which is capable of floating the metal salt particles and concentrating said particles at or near the surface of said paste.

5. The composition according to claims 1 or 4, further including a reducing agent in an amount up to about 20 percent by weight.

6. The composition according to claim 5, wherein the reducing agent is a salt, chosen from the group of sodium sulfite and sodium hydrogen sulfite, which improves the conductivity of the composition.

7. The composition according to claim 1 or 4, wherein the dissolving agent is an acid or an alkali.

* * * * *